(12) United States Patent
Feugnet et al.

(10) Patent No.: US 7,663,763 B2
(45) Date of Patent: Feb. 16, 2010

(54) SEMICONDUCTOR SOLID-STATE LASER GYRO HAVING A VERTICAL STRUCTURE

(75) Inventors: Gilles Feugnet, Les Ulis (FR); Jean-Paul Pocholle, La Norville (FR); Sylvain Schwartz, Paris (FR)

(73) Assignee: Thales, Neuilly-sur-Seine (FR)

( * ) Notice: Subject to any disclaimer, the term of this patent is extended or adjusted under 35 U.S.C. 154(b) by 340 days.

(21) Appl. No.: 11/718,717

(22) PCT Filed: Oct. 26, 2005

(86) PCT No.: PCT/EP2005/055574
§ 371 (c)(1),
(2), (4) Date: May 5, 2007

(87) PCT Pub. No.: WO2006/048398
PCT Pub. Date: May 11, 2006

(65) Prior Publication Data
US 2009/0073452 A1    Mar. 19, 2009

(30) Foreign Application Priority Data
Nov. 5, 2004   (FR) ................................. 04 11816

(51) Int. Cl.
*G01C 19/66* (2006.01)

(52) U.S. Cl. ...................................... 356/470; 356/460
(58) Field of Classification Search ................. 356/468, 356/470, 459, 460, 469, 471
See application file for complete search history.

(56) References Cited

U.S. PATENT DOCUMENTS

| | | | |
|---|---|---|---|
| 4,405,236 A | 9/1983 | Mitsuhashi et al. | |
| 4,431,308 A | 2/1984 | Mitsuhashi et al. | |
| 5,960,022 A | 9/1999 | Halldorsson et al. | |
| 2004/0202222 A1 | 10/2004 | Pocholle et al. | |

FOREIGN PATENT DOCUMENTS

| WO | 02/097370 A | 12/2002 |
|---|---|---|
| WO | WO 02/097370 | 12/2002 |

*Primary Examiner*—Hwa S. A Lee
(74) *Attorney, Agent, or Firm*—Lowe Hauptman Ham & Berner, LLP

(57) ABSTRACT

A laser gyro includes a semiconductor medium and assembled discrete elements, thus offering the possibility of producing large cavities for achieving the desired precision. More precisely, the laser gyro includes an optical ring cavity and a semiconductor amplifying medium with an external cavity having a vertical structure. The semiconductor amplifying medium which is used in reflection includes a stack of plane gain regions that are mutually parallel, and the dimensions of the cavity being substantially are larger than those of the amplifying medium.

9 Claims, 5 Drawing Sheets

SEMICONDUCTOR SOLID-STATE LASER GYRO HAVING A VERTICAL STRUCTURE

CROSS-REFERENCE TO RELATED APPLICATIONS

The present Application is based on International Application No. PCT/EP2005/055573, filed on Oct. 26, 2005 which in turn corresponds to France Application No. 0411815 filed on Nov. 5, 2004; U.S. application Ser. No. 10/478,988 filed on May 28, 2002 and priority is hereby claimed under 35 USC §119 based on these applications. Each of these applications are hereby incorporated by reference in their entirety into the present application.

The field of the invention is that of solid-state laser gyros used in particular in inertia control systems. This type of equipment is used for example for aeronautical applications.

The laser gyro, developed some thirty years ago, is widely commercialized and used at the present time. Its operating principle is based on the Sagnac effect, which induces a frequency difference $\Delta\nu$ between the two emission optical modes propagating in opposite directions, called counter-propagating modes, of a bidirectional ring laser cavity undergoing a rotational movement. Conventionally, the frequency difference $\Delta\nu$ between the two optical modes induced by the rotational movement is equal to:

$$\Delta\nu = 4A\Omega/\lambda L,$$

the L and A are the length and area of the cavity respectively; $\lambda$ is the laser emission wavelength without the Sagnac effect; and $\Omega$ is the speed of rotation of the assembly. The $\Delta\nu$ measurement, obtained by spectral analysis of the beat between the two emitted beams, makes it possible to determine the value of $\Omega$ with very great precision.

In standard laser gyros, the amplifying medium is a gas mixture consisting of helium and neon atoms in appropriate proportion. The gaseous nature of the amplifying medium is however, a source of technical complications when producing the laser gyro, especially because of the high gas purity required and the premature ware of the cavity during its use due in particular to gas leakages and to deterioration of the high-voltage electrodes used for establishing the population inversion.

It is possible to produce a solid-state laser gyro operating in the visible or the near infrared using, for example, an amplifying medium based on crystals doped with rare-earth ions, such as neodymium, erbium or ytterbium ions, instead of the helium/neon gas mixture, the optical pumping then being provided by laser diodes operating in the near infrared. Thus, all the inherent problems associated with gas mixture of the amplifying medium are de facto eliminated.

It is also possible to produce a solid-state laser gyro from optically or electrically pumped semiconductor media. Currently laser gyros of the latter type are monolithic and small in size. They do not make it possible, on the one hand, to achieve the precision comparable to that of gas laser gyros and, on the other hand, to implement optical methods either to eliminate the frequency coupling at low rotation speeds, a phenomenon called the blind spot, or to compensate for noise phenomenon of thermal origin.

One subject of the invention is a solid-state laser gyro comprising a semiconductor medium with an external cavity and consisting of assembled discrete elements, thus offering the possibility of producing large cavities and making it possible to achieve both the desired precision and to insert optical elements in the cavity.

More precisely, the subject of the invention is a laser gyro comprising at least one optical ring cavity and a solid-state amplifying medium that are arranged so that two optical waves of average wavelength $\lambda_0$ can propagate in opposite directions within the cavity, characterized in that the dimensions of the cavity are substantially larger than those of the amplifying medium and that said amplifying medium is a semiconductor medium of average optical index n, with a vertical structure comprising a stack of mutually parallel plane gain regions.

Advantageously, the semiconductor medium includes a plane mirror placed beneath the gain regions and parallel to said regions so that the two optical waves propagating within the cavity are reflected by said mirror after passing through the gain regions. Advantageously, the optical waves propagating within the cavity are reflected by the mirror at an oblique angle of incidence i, the mirror is a Bragg stack optimized for being completely reflecting at the average wavelength $\lambda_0$ and at said oblique angle of incidence i, and the stack of gain regions includes, on the surface on the opposite side from that of the mirror, an antireflection treatment at the average wavelength $\lambda_0$ and at the oblique angle of incidence i.

Advantageously, the amplifying medium is designed so that the intensity maxima of the interference pattern obtained by the optical waves propagating within the semiconductor medium lie in the plane of the gain regions, said gain regions then being separated from one another by $$\frac{\lambda_0}{2n\cos(i)}.$$

Advantageously, the laser gyro includes photodetection means for detecting the intensity of the counterpropagating waves, the intensity modulations of said waves constituting the angular-velocity or angular-position measurement signal of the laser gyro.

Another subject of the invention is an angle or angular-velocity measurement system comprising at least one laser gyro according to the invention.

Advantageously, the cavities of the laser gyros of the measurement system are oriented so as to take measurements in three independent directions.

The invention will be more clearly understood and other advantages will become apparent on reading the following description given by way of nonlimiting example and thanks to the appended figures in which:

FIG. 1 is a diagram showing the basic principle of a laser gyro according to the invention. It comprises:

Figure 1:
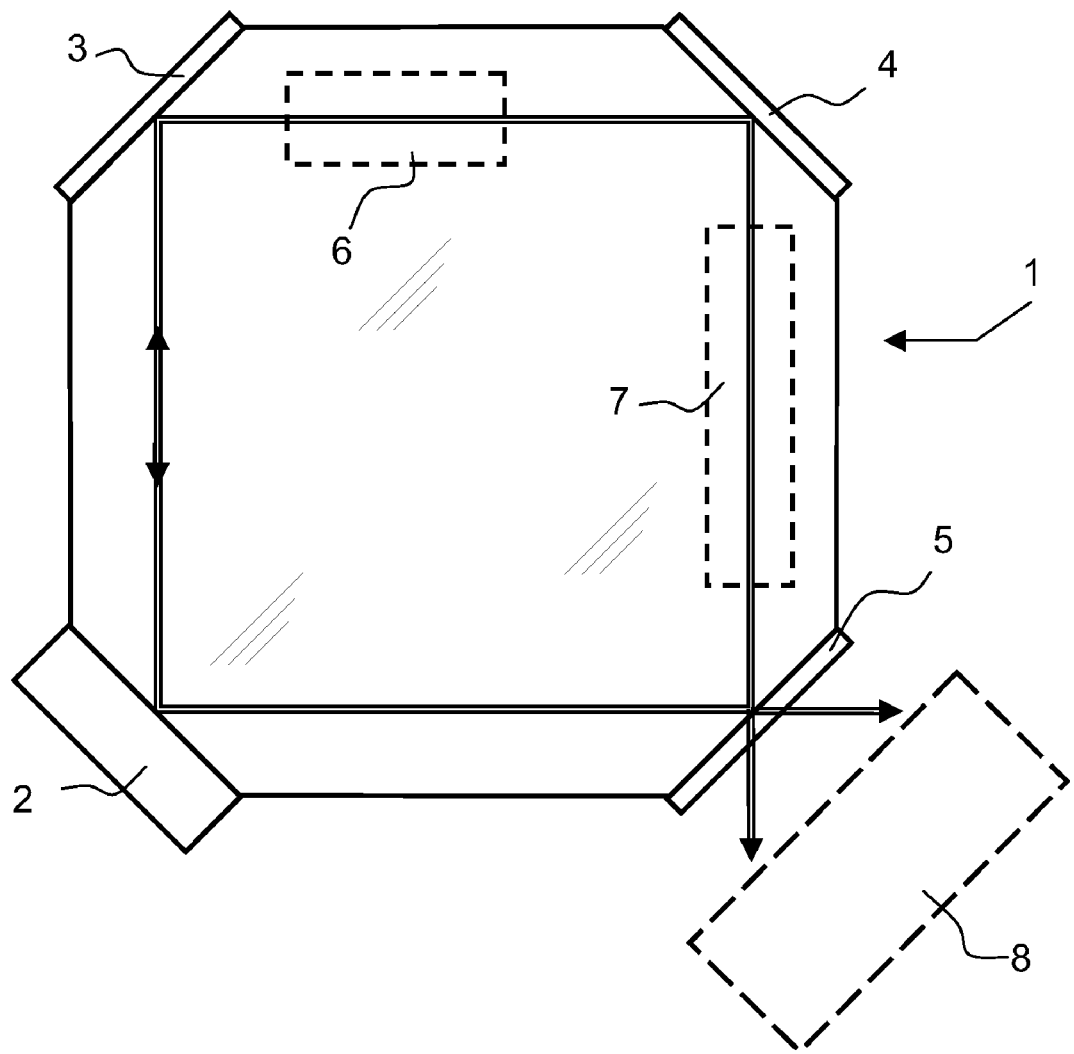
FIG. 1 shows a diagram of a laser gyro according to the invention.

the cavity 1 made in a first material and comprising several deflection mirrors 3 and 4 and a partially reflecting mirror 5;

a semiconductor amplifying medium 2;

optionally, optical elements 6 and 7 (shown dotted) used for example to eliminate the blind spot or to introduce thermal compensation;

the assembly being arranged so that two optical waves can propagate in two opposed directions within the cavity. These two waves are represented by a double line in FIG. 1, which waves pass through the various optical elements placed in the cavity; and an opto-electronic measurement device 8 (shown dotted) for calculating the angle parameter measured from the interference pattern between the counterpropagating waves coming from the partially reflecting mirror 5.

Independently of the materials used and the operating wavelengths, the main choices relating to the semiconductor medium are:

its structure; and its mode of operation in transmission or in reflection.

Figure 2:
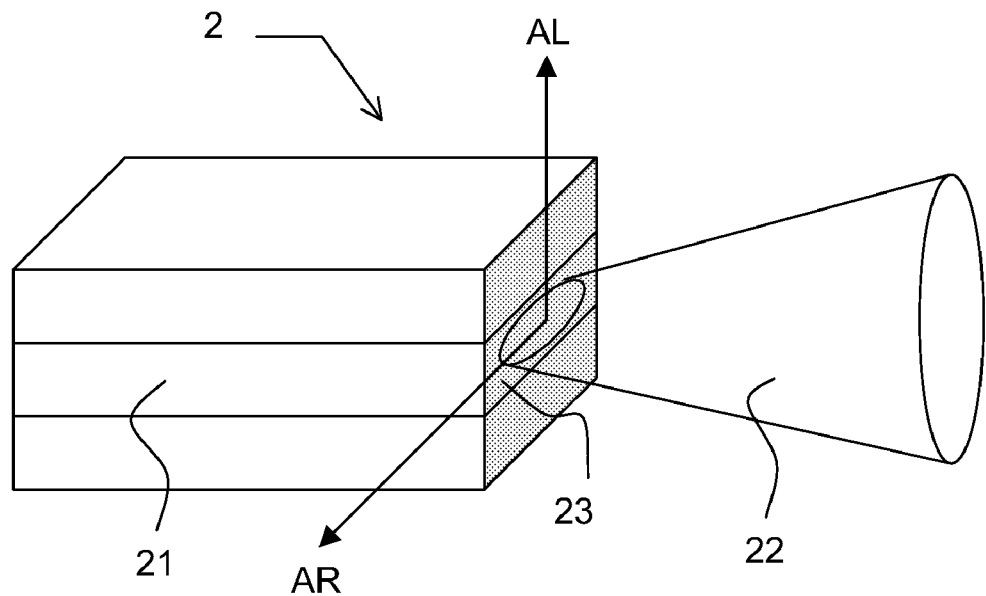
FIG. 2 shows the geometry of a semiconductor laser medium in the form of a strip.
Figure 3:
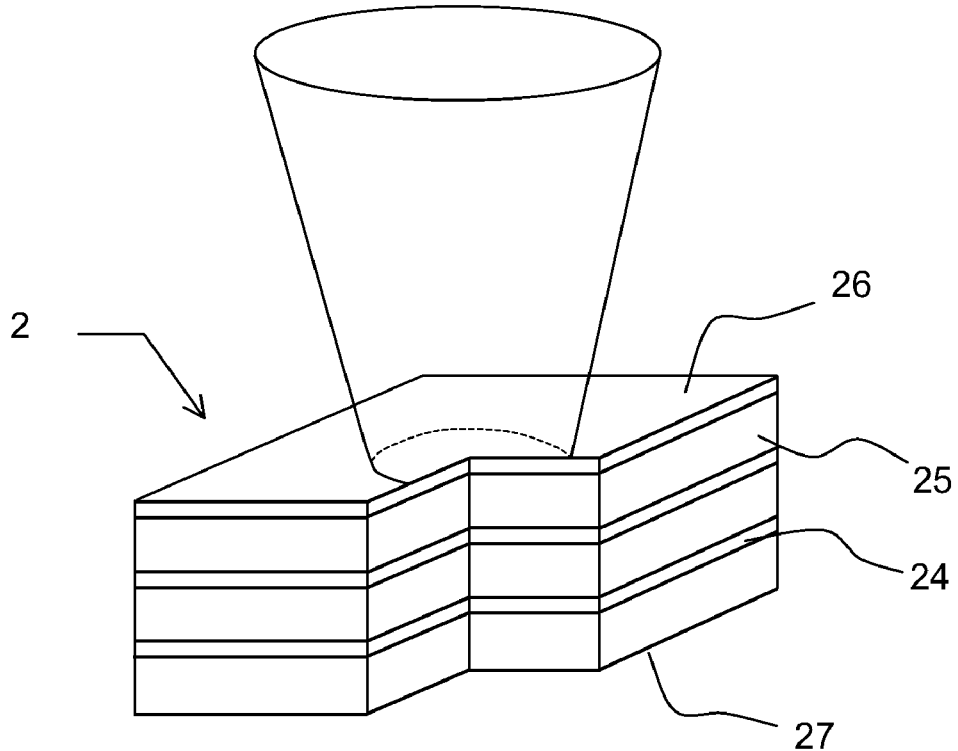
FIG. 3 shows the geometry of a semiconductor laser medium of vertical structure.

Semiconductor media are available mainly in two types of structure:

in strip form; FIG. 2 shows such a structure 2. The active region 21 in which the stimulated emission takes place is continuous. The optical beam 22 is emitted via one of the lateral faces 23. The optical mode 22 propagating in this structure may be multimode. In this case, the geometry of the beam is asymmetric, as indicated in FIG. 2. The height of the mode corresponding to its dimension along the AR axis, called the rapid axis, is then generally a few microns and its width corresponding to its dimension along the AL axis, called the slow axis, is several tens of microns. The optical mode propagating in this structure may also be monomode. It is then symmetrical and structures are then referred to as transverse monomode structures. For gyrometric applications, the use of a semiconductor laser medium in the form of a transverse monomode strip is complicated. This is because the mode must have a diameter of a few microns inside the cavity of the strip and a diameter of several tens of microns outside the cavity. The propagation of the mode in the active region must also be guided. The use of a non-transverse-monomode strip is not easier since the mode, in addition to being focused and guided along the slow axis, must be highly elliptical;

vertical structure: FIG. 3 shows such a structure in which the active medium is then discontinuous. It is made up of a stack of thin active regions 24, the thickness of which typically is around ten nanometers, the regions being separated by thicknesses 25 equal to $\lambda/2n$. The light is then emitted via the top face 26 or bottom face 27 and the mode propagating in this type of cavity possesses symmetry of revolution. These structures are called VCSEL (Vertical Cavity Surface Emitting Laser) structures when the laser is completely monolithic, the gain regions then being sandwiched between two Bragg stacks, one being completely reflecting and the other, the output mirror, having a transmission of about 0.1%. When the output mirror is a discrete element, these cavities are called VECSEL (Vertical External Cavity Surface Emitting Laser) structures. In FIG. 3, only the stack of active regions has been shown. The completely reflecting mirror may be a Bragg mirror or a dielectric mirror attached to the structure. The treatment of the face from the opposite structure to the mirror may comprise an antireflection treatment. It is also possible, by adjusting its reflection coefficient, to promote the monomode emission of this structure.

For gyrometric applications, the use of a vertical structure is more appropriate insofar as the gain regions may have a diameter of around one hundred microns, close to the dimensions of the optical beam circulating in the cavity. This also allows propagation of the unguided wave.

However, these vertical structures cannot be used simply in transmission in a laser gyro. Consider two counterpropagating waves, the electric field vectors of which are denoted by $\vec{E}_+$ and $\vec{E}_-$ where $\vec{E}_+ = \vec{E}_{0+} e^{i(\vec{k}\cdot\vec{r} - \omega_+ t + \phi_+)}$ and $\vec{E}_- = \vec{E}_{0-} e^{i(-\vec{k}\cdot\vec{r} - \omega_- t + \phi_-)}$, k conventionally representing the wavevector of the wave, $\omega$ its angular frequency and $\phi$ its initial phase. The signs + and − indicate the direction of propagation of the wave.

In the cavity of the laser gyro, the total electric field $E_t$ coming from the interference of the two waves is equal to:

$$\vec{E}_t = \vec{E}_{0+} e^{i(\vec{k}\cdot\vec{r} - \omega_+ t + \phi_+)} + \vec{E}_{0-} e^{i(-\vec{k}\cdot\vec{r} - \omega_- t + \phi_-)}$$

and the corresponding total intensity $I_t$ is equal to:

$$I_t = \vec{E}_t \cdot \vec{E}_t^* = I_{0+} + I_{0-} + 2\sqrt{I_{0-} I_{0+}} \cos(2\vec{k}\cdot\vec{r} - (\omega_+ - \omega_-)t + \phi_+ - \phi_-).$$

For a fixed point in the cavity, the intensity therefore varies with time between a maximum and a minimum with an angular frequency equal to $(\omega_+ - \omega_-)$, so that it seems that the wave moves relative to this point. If a vertical structure operating in transmission is placed in the cavity, the intensity maxima may be superposed on the gain regions. The stationary wave is then no longer free to move under the effect of a rotation. What is thus obtained is "gain-induced frequency locking" which makes the device unusable as a laser gyro.

The operation in reflection of these vertical structures allows the above drawbacks to be overcome.

Figure 4:
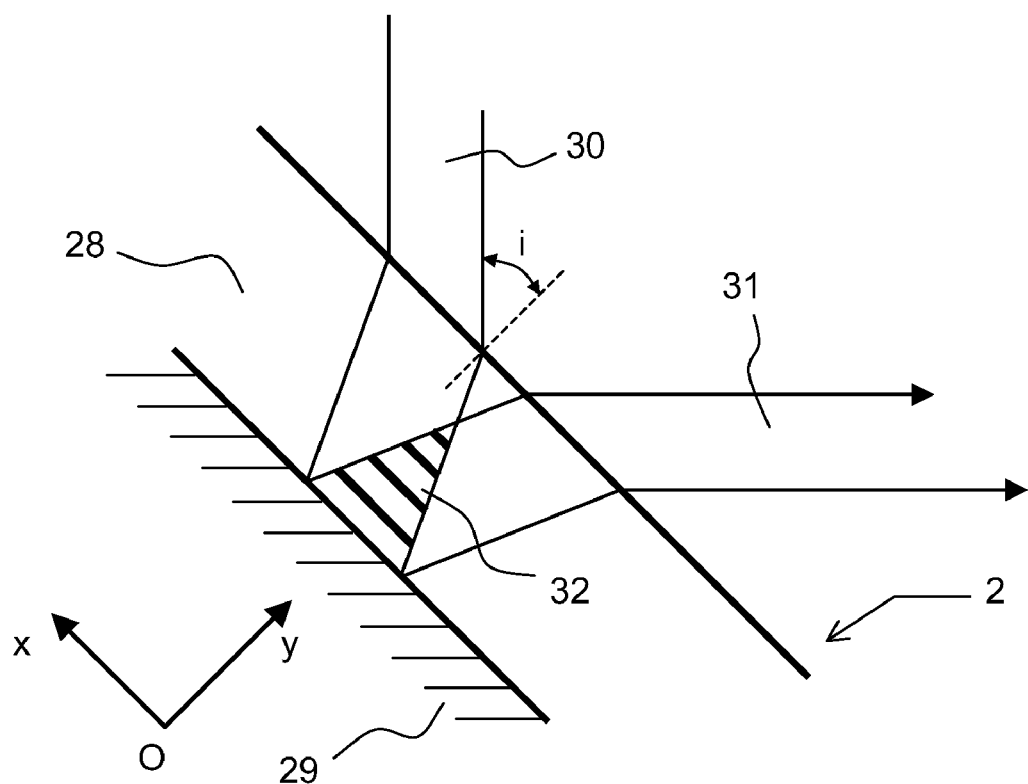
FIGS. 4 and 5 show the geometry of the stationary wave created in a structure by an incident wave and by its reflection off a mirror placed beneath said structure.

FIG. 4 shows a vertical structure 2, seen in cross section, which operates in reflection. To simplify matters, the structure is considered to be likened to an active medium 28 of index n on which a mirror 29 is deposited. When the structure is illuminated by a single wave, the incident wave 30 and the wave 31 reflected by the mirror 29 interfere in the active medium 28. This interference region 32 is shown in FIG. 4 by a triangular hatched area. The parameters associated with the incident wave are subscripted with the +symbol and the parameters associated with the reflective wave are subscripted with the +r symbol. Also, i denotes the angle of incidence.

In the (O,Ox,Oy) reference frame of FIG. 4, the propagation vectors $\vec{k}_+$ and $\vec{k}_{+r}$ of the incident and reflected waves in the active medium are expressed as, respectively:

$$\vec{k}_+ = \frac{2\pi}{\lambda_0} n \begin{vmatrix} \sin(i) \\ \cos(i) \end{vmatrix}$$

and $$\vec{k}_{+r} = \frac{2\pi}{\lambda_0} n \begin{vmatrix} -\sin(i) \\ \cos(i) \end{vmatrix}$$

The field $\vec{E}_+$ representative of the incident wave is given by:

$$\vec{E}_+ = \vec{E}_{0+} e^{i(\vec{k}_+ \cdot \vec{r} - \omega_+ t + \phi_+)}$$

and the field $\vec{E}_-$ representative of the reflected incident wave is expressed, if the reflection coefficient is equal to $\sqrt{R}e^{i\phi_0}$:

$$\vec{E}_- = \sqrt{R}\vec{E}_{0+r}e^{i(\vec{k}_{+r}\cdot\vec{r}-\omega_+t+\phi_++\phi_0)}.$$

In the region in which the two waves are superposed, the total electric field $\vec{E}_{total}$, at the point $\vec{r}$ is given by:

$$\vec{E}_{total} = \vec{E}_{0+}e^{i(\vec{k}_+\cdot\vec{r}-\omega_+t+\phi_+)} + \sqrt{R}\vec{E}_{0+r}e^{i(\vec{k}_{+r}\cdot\vec{r}-\omega_+t+\phi_++\phi_0)}$$

and the total intensity $I_t$, which is conventionally equal to $\vec{E}_{total}\cdot\vec{E}^*_{total}$ is equal to:

$$I_t = I_{0+} + RI_{0+} + 2\sqrt{R}\,I_{0+}e\left(\vec{E}_{0+}\cdot\vec{E}^*_{0+r}e^{i((\vec{k}_{+r}-\vec{k}_+)\cdot\vec{r}+\varphi_0)}\right),$$

or else, by replacing the wavevectors with their expressions as a function of the wavelength $\lambda_0$:

$$I_t = I_{0+} + RI_{0+} + 2\sqrt{R}\,I_{0+}e\left(\vec{E}_{0+}\cdot\vec{E}^*_{0+r}e^{i\left(\frac{4\pi}{\lambda_0}n\cos(i)y+\varphi_0\right)}\right).$$

Figure 6:
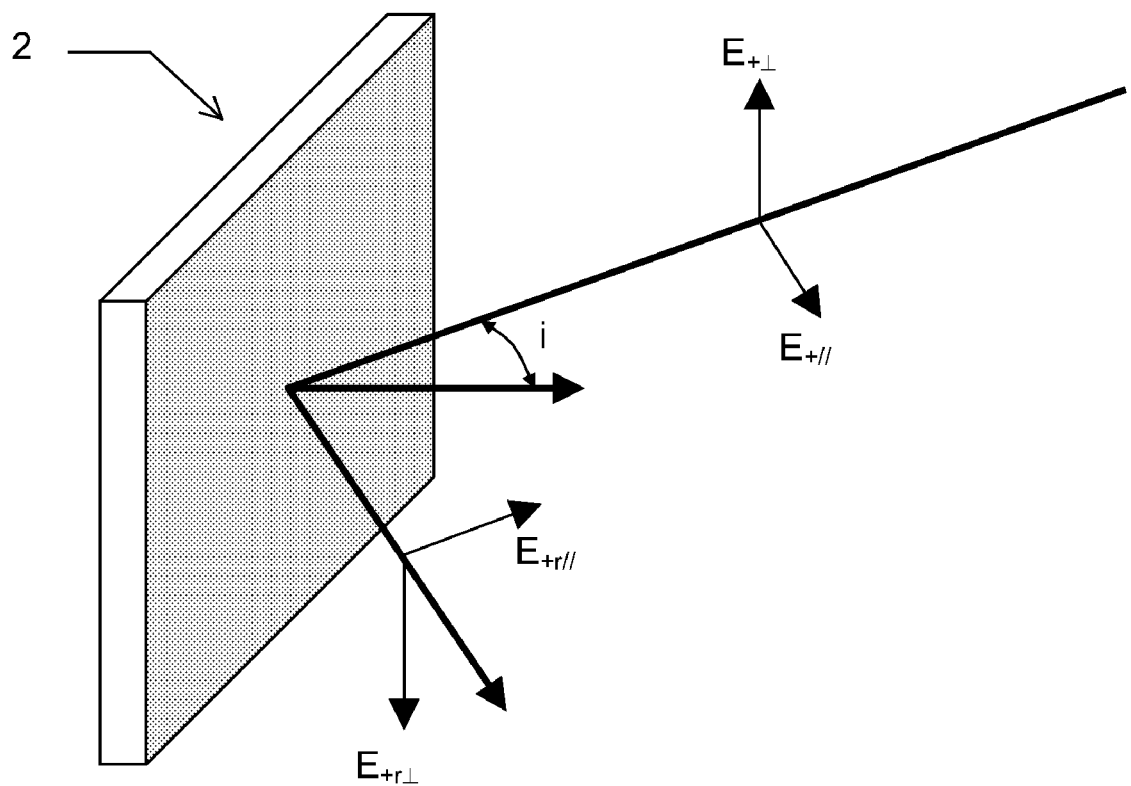
FIG. 6 shows the polarization state of the incident and reflected waves in the case of FIG. 4.

The scalar product $\vec{E}_{0+}\cdot\vec{E}^*_{0+r}$ depends on the polarization of the incident wave. FIG. 6 represents a basis of possible linear polarization states of the incident wave and the reflected wave, these states being called perpendicular state and parallel state depending on whether the vector representative of the electric field of the wave lies in the plane of incidence or is perpendicular to it. These vectors are denoted by $E_{+//}$, $E_{+r//}$, $E_{+\perp}$ and $E_{+r\perp}$ in FIG. 6.

If the wave is in a parallel polarization state, the scale of products $\vec{E}_{0+}\cdot\vec{E}^*_{0+r}$ is equal to $|\vec{E}_{0+}||\vec{E}_{0+r}|\cos(\pi-2i)$. If the wave is in a perpendicular polarization state, the scalar of product $\vec{E}_{0+}\cdot\vec{E}^*_{0+r}$ is equal to $-|\vec{E}_{0+}||\vec{E}_{0+r}|$.

To simplify the expressions, real $\vec{E}_{0+}$ and $\vec{E}^*_{0+r}$ values are chosen and R, the intensity reflection coefficient, is chosen to be equal to 1. The total intensity is then rewritten as:

$$I_t = 2I_{0+}\left[1 + \cos\left(\frac{4\pi}{\lambda_0}n\cos(i)y+\varphi_0\right)\right]$$

$$I_t = 4I_{0+}\cos^2\left(\frac{2\pi}{\lambda_0}n\cos(i)y+\varphi_0\right).$$

The interference pattern corresponding to the intensity $I_t$ is fixed. It is made up of an array of equidistant plane interference fringes parallel to the mirror with a period of $$\frac{\lambda_0}{2n\cos(i)}.$$

Figure 5:
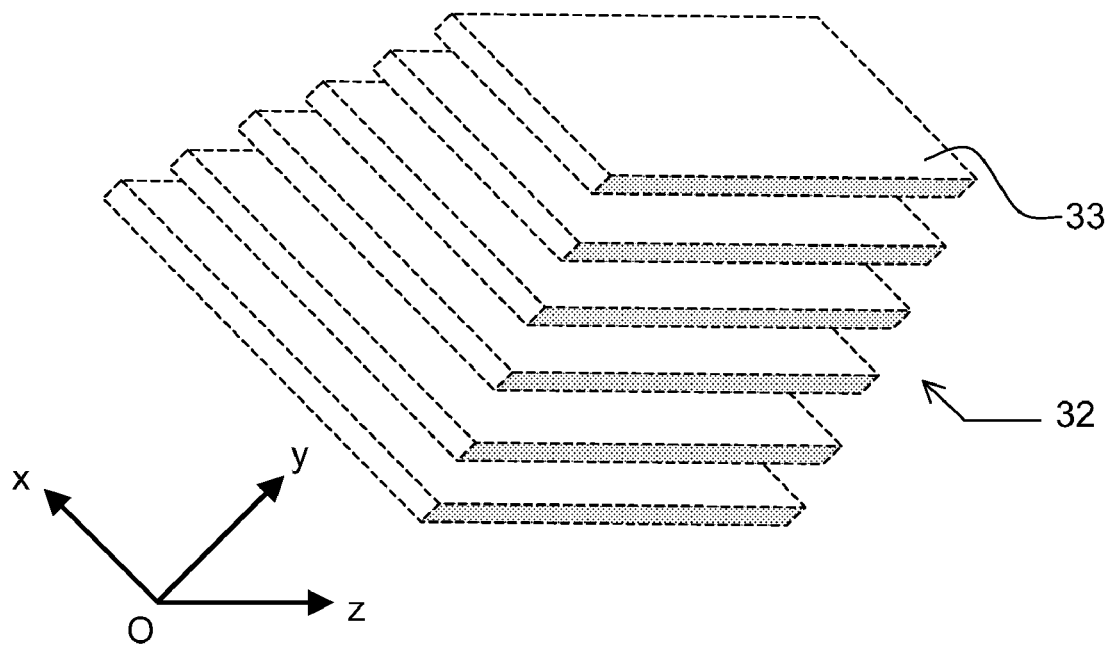

FIG. 5 shows the structure of the interference fringes 33 in the (O,Ox,Oy,Oz) reference frame. Each parallelepiped represents the position of the intensity maxima.

Figure 7:
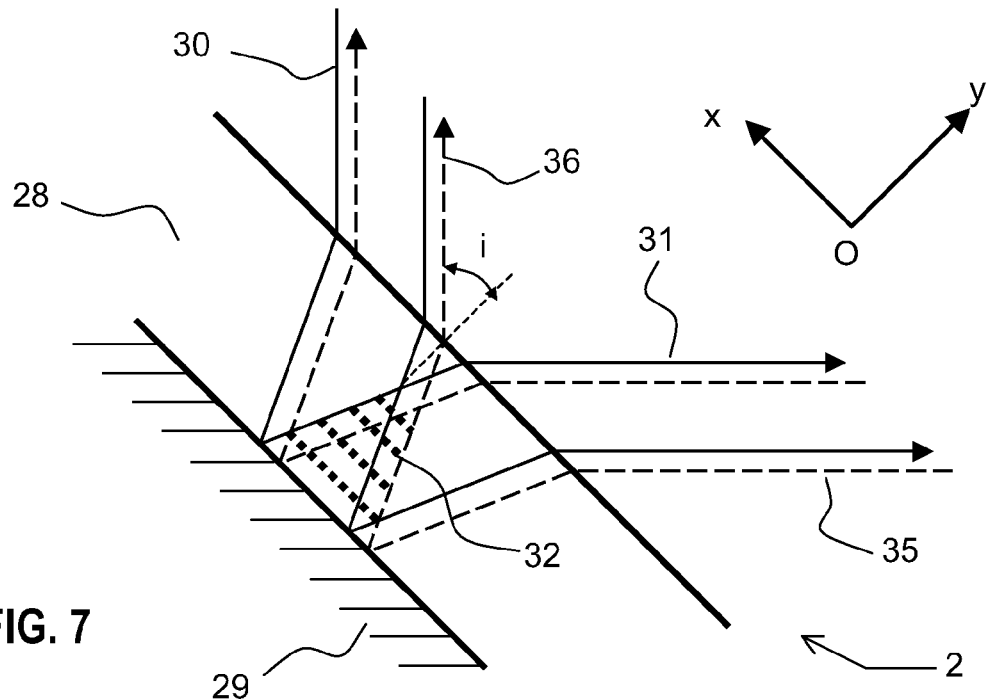
FIG. 7 shows the geometry of the stationary wave created in a structure by two incident waves propagating in opposite directions and by their reflections off a mirror placed beneath said structure.

FIG. 7 shows a vertical structure 2, seen in cross section, operating in reflection. To simplify matters, the structure is considered to be likened to an active medium 28 of index n, on which a mirror 29 is deposited. When it is illuminated by two counterpropagating waves of different frequencies, four waves 30, 31, 35 and 36 then interfere with one another:

a first incident wave 30 circulating in a first direction denoted by +, which, using the same notations as previously, has a field equal to, $\vec{E}_{0+}e^{i(\vec{k}_+\cdot\vec{r}-\omega_+t+\phi_+)}$;

the reflected wave 31 corresponding to this first incident wave has a field equal to $\sqrt{R}\,\vec{E}_{0+}e^{i(-\vec{k}_+\cdot\vec{r}-\omega_+t+\phi_++\phi_0)}$;

a second incident wave 35 circulating in the opposite direction, denoted by − has a field equal to $\vec{E}_{0-}e^{i(\vec{k}_-\cdot\vec{r}-\omega_-t+\phi_-)}$; and the reflected wave 36 corresponding to this second incident wave, has a field equal to $\sqrt{R}\,\vec{E}_{0-}e^{i(-\vec{k}_+\cdot\vec{r}-\omega_-t+\phi_-+\phi_0)}$.

The total field $\vec{E}_{total}$ is then written as:

$$\vec{E}_{total} = \vec{E}_{0+}e^{i(\vec{k}_+\cdot\vec{r}-\omega_+t+\varphi_+)} + \sqrt{R}\,\vec{E}_{0+}e^{i(-\vec{k}_-\cdot\vec{r}-\omega_+t+\varphi_++\varphi_0)} +$$
$$\vec{E}_{0-}e^{i(\vec{k}_-\cdot\vec{r}-\omega_-t+\varphi_-)} + \sqrt{R}\,\vec{E}_{0-}e^{i(-\vec{k}_+\cdot\vec{r}-\omega_-t+\varphi_-+\varphi_0)}$$

$$= \vec{E}_0\begin{bmatrix} e^{i\frac{\varphi_++\varphi_-+\varphi_0}{2}}e^{-i\frac{\omega_++\omega_-}{2}t}\left(\begin{array}{c} e^{i(\vec{k}_+\cdot\vec{r}+\frac{\varphi_+-\varphi_--\varphi_0}{2})}e^{-i\frac{\omega_+-\omega_-}{2}t} + \\ \sqrt{R}\,e^{-i(\vec{k}_-\cdot\vec{r}+\frac{\varphi_+-\varphi_--\varphi_0}{2})}e^{i\frac{\omega_+-\omega_-}{2}t} \end{array}\right) + \\ e^{i\frac{\varphi_++\varphi_-+\varphi_0}{2}}e^{-i\frac{\omega_++\omega_-}{2}t}\left(\begin{array}{c} \sqrt{R}\,e^{-i(\vec{k}_-\cdot\vec{r}-\frac{\varphi_+-\varphi_-+\varphi_0}{2})}e^{i\frac{\omega_+-\omega_-}{2}t} + \\ e^{i(\vec{k}_-\cdot\vec{r}-\frac{\varphi_+-\varphi_-+\varphi_0}{2})}e^{i\frac{\omega_+-\omega_-}{2}t} \end{array}\right) \end{bmatrix}$$

As previously, to simplify the calculations, the modulii of the electric fields are taken to be real and equal, and R, the intensity reflection coefficient, is taken to be equal to 1. The total field can then be written as:

$$\vec{E}_{total} = 2e^{\frac{i}{2}(\varphi_++\varphi_-+\varphi_0-\omega_+t-\omega_-t)}$$

$$\left[\cos\left(\vec{k}_+\cdot\vec{r} - \frac{\omega_+-\omega_-}{2}t + \frac{\varphi_+-\varphi_--\varphi_0}{2}\right) + \right.$$
$$\left.\cos\left(\vec{k}_-\cdot\vec{r} + \frac{\omega_+-\omega_-}{2}t - \frac{\varphi_+-\varphi_-+\varphi_0}{2}\right)\right]\vec{E}_0$$

$$= 4e^{i\frac{\varphi_++\varphi_-+\varphi_0}{2}}e^{-i\frac{\omega_++\omega_-}{2}t}\vec{E}_0\cos\left(\frac{(\vec{k}_++\vec{k}_-)\cdot\vec{r}}{2}-\varphi_0\right)\cdot$$

$$\cos\left(\frac{\frac{(\vec{k}_+-\vec{k}_-)\cdot\vec{r}}{2}-(\omega_+-\omega_-)t+}{\frac{\varphi_+-\varphi_--\varphi_0+\varphi_+-\varphi_-+\varphi_0}{4}}\right)$$

$$= 4e^{i\frac{\varphi_++\varphi_-+\varphi_0}{2}}e^{-i\frac{\omega_++\omega_-}{2}t}\vec{E}_0\cos\left(\frac{(\vec{k}_++\vec{k}_-)\cdot\vec{r}}{2}-\varphi_0\right)$$

$$\cos\left(\frac{(\vec{k}_+-\vec{k}_-)\cdot\vec{r}}{2}-(\omega_+-\omega_-)t+\frac{\varphi_1-\varphi_2}{2}\right).$$

Since $\vec{k}_+ = -\frac{2\pi}{\lambda_0}n\begin{vmatrix}\sin(i)\\\cos(i)\end{vmatrix}$ and $\vec{k}_- = -\vec{k}_{+r} = \frac{2\pi}{\lambda_0}n\begin{vmatrix}\sin(i)\\-\cos(i)\end{vmatrix},$ then $\vec{k}_+ + \vec{k}_- = \frac{4\pi n}{\lambda_0}\begin{vmatrix}0\\\cos(i)\end{vmatrix}$ and $\vec{k}_+ - \vec{k}_- = -\frac{4\pi n}{\lambda_0}\begin{vmatrix}\sin(i)\\0.\end{vmatrix}$ Therefore:

$$\vec{E}_{total} = 4e^{-i\frac{\omega_+ + \omega_-}{2}t} e^{i\frac{\varphi_1 + \varphi_2 \varphi_0}{2}} \vec{E}_0 \cos\left(-\frac{2\pi n}{\lambda_0}\cos(i)y - \varphi_0\right)$$

$$\cos\left(\frac{2\pi n}{\lambda_0}\sin(i)x - (\omega_+ - \omega_-)t + \frac{\varphi_1 - \varphi_2}{2}\right)$$

From the expression for the total field, the value of the total intensity $I_{total}$ is calculated, this being equal to:

$$I_{total} = 16 I_0 \cos^2\left(\frac{\frac{2\pi n}{\lambda_0}\sin(i)x +}{(\omega_+ - \omega_-)t - \frac{\varphi_1 - \varphi_2}{2}}\right) \cos^2\left(\frac{2\pi n}{\lambda_0}\cos(i)y + \frac{\varphi_0}{2}\right)$$

Figure 8:
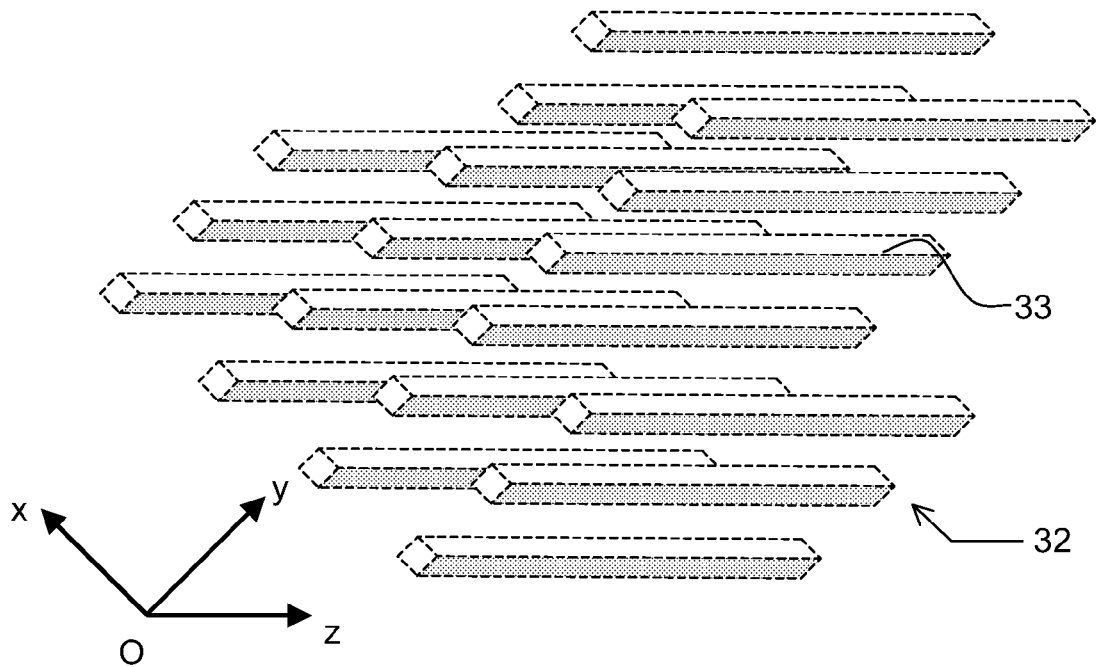
FIG. 8 shows the variations in intensity of the stationary wave in the configuration of FIG. 7.

Thus, when two waves circulate in the medium of index n, as is the case when there is bidirectional emission in a laser gyro, the maximum intensity is located along fixed lines parallel to the mirror. FIG. 8 illustrates this interference pattern.

If the medium is made up of a stack of thin active regions, by making these lines coincide with the active regions the operation of the laser is thus optimized.

There is indeed a traveling wave along these lines, but this introduces only a slight modulation of the gain saturation. This is because there generally exists a large number of maxima within the interfering optical beams. The traveling wave introduces at most a variation in a maximum, a negligible variation.

To give an example, for a wavelength $\lambda_0$ equal to 1 micron, for an average angle of incidence i of 45° and an average of optical index n of 3, two maxima of the traveling wave moving in the plane of the mirrors along Ox are separated by a distance d equal to:

$$d = \frac{\lambda_0}{2n\sin(i)} \approx \frac{\lambda_0}{2n \times 0.23} \approx 0.7 \text{ μm}.$$

Consequently, a light beam with an average diameter of 100 microns has 140 maxima. Thus, and without taking into account the Gaussian profile of the mode that enhances the roll at the center of the beam relative to its edges, the gain modulation is equal to at most 1 maximum over 140, i.e. 0.7%. Such a low modulation does not involve gain locking. It involves a slight modulation of the output power, which may advantageously be used as a read signal.

To optimize this operation, the completely reflecting mirror is a Bragg stack or an attached dielectric mirror optimized for the desired angle of incidence. This stack or this mirror allows reflection coefficients close to 100% to be achieved.

The gain regions, fabricated on top of this stack, must be correctly positioned. To do this, their pitch is $$\frac{\lambda_0}{2n\cos(i)}$$

and the position of the first region relative to the stack is optimized so as to take into account the possible fixed phase shifts so that all the gain regions coincide with the lines parallel to the plane of the structure for which the intensity is a maximum.

On the output face, another stack may be fabricated with a larger or smaller reflection coefficient if it is desired to benefit in the gain region from a subcavity effect that increases the effective gain seen by the cavity of the laser gyro. If a pump beam is used, the stack through which the pump beam passes may also be produced so as to be an antireflection at the wavelength of said pump beam.

It should also be pointed out that the possibility of multimode emission by nonuniform saturation of the gain, also called "spatial hole burning" are reduced. This is because the period of the interference pattern varies slightly as a function of the wavelength. Thus, for a semiconductor emitting at one micron having a gain width of 1 nanometer, the pitch changes by at most 0.1%. Consequently, the only way for a wave to exploit an unsaturated gain region would be to have a very different wavelength, which is impossible because of the spectral width of the gain.

The invention claimed is:

1. A laser gyro comprising:
    an optical ring cavity and a solid-state amplifying medium that are arranged so that two optical waves of average wavelength $\lambda_0$ propagates in opposite directions within the cavity,
    wherein
    dimensions of the cavity are substantially larger than those of the amplifying medium,
    said amplifying medium is a semiconductor medium of average optical index n, with a vertical structure which comprises a stack of mutually parallel plane gain regions,
    the semiconductor medium includes a plane mirror placed beneath the gain regions and parallel to said regions so that the two optical waves propagating within the cavity are reflected by said plane mirror after passing through the gain regions at an oblique angle of incidence I,
    wherein, the stack of gain regions includes, on the surface on the opposite side from that of the mirror, an optical treatment at the average wavelength $\lambda_0$ and at the oblique angle of incidence I, with a sufficient reflection coefficient to benefit in the gain region from a subcavity effect.

2. The laser gyro as claimed in claim 1, wherein the mirror is a Bragg stack optimized for being completely reflecting at the average wavelength $\lambda_0$ and at the oblique angle of incidence i.

3. The laser gyro as claimed in claim 1, wherein the mirror is a mirror attached beneath the gain regions and designed to be completely reflecting at the average wavelength $\lambda_0$ and at the oblique angle of incidence i.

4. The laser gyro as claimed in claim 2, wherein the amplifying medium is designed so that the intensity maxima of the interference pattern obtained by the optical waves propagating within the semiconductor medium lie in the plane of the gain regions.

5. The laser gyro as claimed in claim 4, wherein the gain regions are separated from one another by $$\frac{\lambda_0}{2n\cos(i)}.$$

6. The laser gyro as claimed in claim 1, comprising photodetection means for detecting the intensity of the counterpropagating waves, the intensity modulations of said waves constituting the angular-velocity or angular-position measurement signal of the laser gyro.

7. An angle or angular-velocity measurement system, comprising at least one laser gyro, said layer gyro comprising:

an optical ring cavity and a solid-state amplifying medium that are arranged so that two optical waves of average wavelength $\lambda_0$ propagates in opposite directions within the cavity, wherein dimensions of the cavity are substantially larger than those of the amplifying medium, said amplifying medium is a semiconductor medium of average optical index n, with a vertical structure which comprises a stack of mutually parallel plane gain regions, the semiconductor medium includes a plane mirror placed beneath the gain regions and parallel to said regions so that the two optical waves propagating within the cavity are reflected by said plane mirror after passing through the gain regions at an oblique angle of incidence I, wherein, the stack of gain regions includes, on the surface on the opposite side from that of the mirror, an optical treatment at the average wavelength $\lambda_0$ and at the oblique angle of incidence I, with a sufficient reflection coefficient to benefit in the gain region from a subcavity effect.

8. The measurement system as claimed in claim 7, comprising three laser gyros, the cavities of which are oriented so as to take measurements in three independent directions.

9. The laser gyro as claimed in claim 3, wherein the amplifying medium is designed so that the intensity maxima of the interference pattern obtained by the optical waves propagating within the semiconductor medium lie in the plane of the gain regions.

* * * * *